(12) United States Patent
Louwet et al.

(10) Patent No.: US 7,932,320 B2
(45) Date of Patent: Apr. 26, 2011

(54) PROCESS FOR PREPARING ELECTROCONDUCTIVE COATINGS

(75) Inventors: Frank Louwet, Diepenbeek (BE); Bert Groenendaal, Sinaai (BE)

(73) Assignee: Agfa-Gevaert, N.V., Mortsel (BE)

( * ) Notice: Subject to any disclaimer, the term of this patent is extended or adjusted under 35 U.S.C. 154(b) by 763 days.

(21) Appl. No.: 11/749,617

(22) Filed: May 16, 2007

(65) Prior Publication Data

US 2008/0017833 A1    Jan. 24, 2008

Related U.S. Application Data

(63) Continuation of application No. 10/870,503, filed on Jun. 17, 2004, now abandoned.

(60) Provisional application No. 60/483,810, filed on Jun. 30, 2003.

(30) Foreign Application Priority Data

Jun. 20, 2003 (EP) .................................... 03101827

(51) Int. Cl.
*C08K 3/00* (2006.01)
(52) U.S. Cl. ........................................ 524/811; 252/500
(58) Field of Classification Search .................. 252/500; 524/811
See application file for complete search history.

(56) References Cited

U.S. PATENT DOCUMENTS

| | | | | |
|---|---|---|---|---|
| 5,766,515 A | * | 6/1998 | Jonas et al. | 252/500 |
| 6,444,400 B1 | * | 9/2002 | Cloots et al. | 430/311 |
| 7,048,874 B2 | * | 5/2006 | Louwet et al. | 252/500 |
| 7,105,620 B2 | * | 9/2006 | Groenendaal et al. | 526/256 |
| 7,108,805 B2 | | 9/2006 | Tahon et al. | |
| 7,122,130 B2 | | 10/2006 | Tahon et al. | |
| 2003/0215571 A1 | | 11/2003 | Tahon | |
| 2005/0220992 A1 | | 10/2005 | Tahon | |
| 2005/0245723 A1 | | 11/2005 | Louwet | |

FOREIGN PATENT DOCUMENTS

| | | |
|---|---|---|
| EP | 0 339 340 A2 | 11/1989 |
| EP | 0 440 957 A2 | 8/1991 |
| EP | 0 686 662 A2 | 12/1995 |
| EP | 1 003 179 A1 | 5/2000 |
| WO | WO 03/001299 A1 | 1/2003 |

OTHER PUBLICATIONS

Adriaensens et al.; *Polymer*, 43, 7003-7006 (2002).
Elschner et al.; *Asia Display/IDW '01*, 1427-1430 (2001).
Kim et al.; *Proc. SPIE*, 4464, 85-91 (2002).
Lefebvre et al.; *Chem. Mater.*, 11, 262-268 (1999).
Pettersson et al.; *Organic Electronics*, 3, 143-148 (2002).
Search Report for EP 03 10 1827 (Nov. 6, 2003).

* cited by examiner

*Primary Examiner* — Robert D. Harlan
(74) *Attorney, Agent, or Firm* — Leydig, Voit & Mayer, Ltd.

(57) ABSTRACT

An aqueous dispersion of latex particles, said latex particles containing a polymer containing monomer units according to formula (I):

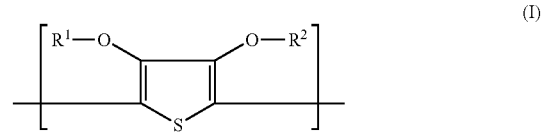

(I)

in which $R^1$ and $R^2$ independently of one another represent hydrogen or a $C_{1-5}$-alkyl group or together form an optionally substituted $C_{1-5}$-alkylene residue and at least one polyanion compound.

61 Claims, No Drawings

PROCESS FOR PREPARING ELECTROCONDUCTIVE COATINGS

CROSS-REFERENCE TO RELATED PATENT APPLICATIONS

This application is a continuation of co-pending U.S. patent application Ser. No. 10/870,503, filed Jun. 17, 2004, which claims the benefit of U.S. Provisional Application No. 60/483,810 filed Jun. 30, 2003, and European Application No. 03101827.8 filed Jun. 20, 2003, the disclosures of which are incorporated by reference.

FIELD OF THE INVENTION

The present invention relates to a process for preparing electroconductive coatings.

BACKGROUND OF THE INVENTION

Polythiophenes have been studied extensively due to their interesting electrical and/or optical properties. Polythiophenes become electrically conducting upon chemical or electrochemical oxidation or reduction. Their ultimately achievable electrical conductivity is determined by their chemical composition, the stereoregularity of the polymerization of the thiophene monomers in the polythiophene chain and by their $\pi$-conjugation lengths. Such stereoregularity problems do not arise when unsubstituted thiophenes or thiophenes substituted in the 3- and 4-positions with identical groups are polymerized.

EP-A 339 340 discloses a polythiophene containing structural units of the formula:

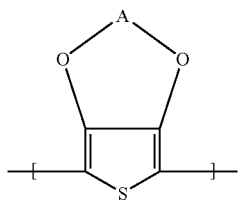

in which A denotes an optionally substituted C1-C4-alkylene radical and its preparation by oxidative polymerization of the corresponding thiophene.

EP-A 440 957 discloses dispersions of polythiophenes, constructed from structural units of formula (I):

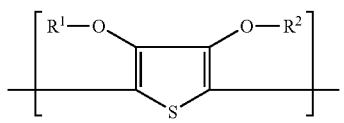

in which $R^1$ and $R^2$ independently of one another represent hydrogen or a C1-C4 alkyl group or together form an optionally substituted C1-C4-alkylene residue, in the presence of a polyanion compound and specifically discloses in Examples the polymerization of 3,4-ethylenedioxythiophene [EDOT] in the presence of poly(styrene sulphonic acid) at a weight ratio of 1:1.29 (Example 2), 1:2.2 (Examples 7 and 8), 1:4 (Examples 1, 3, 4 and 10), 1:6 (Example 5) and 1:8.33 (Example 6) in water.

In 2001, Elschner et al. at ASIA DISPLAY/IDW'0 held at Nagayo in Japan in October 2001 in paper OEL3-3 disclosed high resistivity PEDOT/PSS for reduced crosstalk in passive matrix OEL's and presented characteristic data of standard BAYTRON™ P and BAYTRON™ P types AI4083 and CH8000, reproduced below:

| BAYTRON P Type | Resistivity [Ω-cm] | Centre of particle size distribution [nm] | PSS:PEDOT composition by weight |
|---|---|---|---|
| standard | 1 | 110 | 2.5:1 |
| VP AI4083 | 500-1000 | 55 | 6:1 |
| VP CH8000 | 70,000-200,000 | 20 | 20:1 |

Elschner et al. further report that the conductivity decreased by several orders of magnitude relative to standard BAYTRON™ P just be shifting the centre of the particle size distribution from about 100 nm to 20 nm, while noting that the sizes of gel particles are taken in their aqueous swollen state and are of smaller size after dehydration. BAYER's current commercial literature gives the following characteristics for these three BAYTRON™ P grades:

| BAYTRON P Type | Resistivity [Ω-cm] | particle size distribution (swollen) | | |
|---|---|---|---|---|
| | | $d_{50}$ [nm] | $d_{90}$ [nm] | $d_{95}$ [nm] |
| VP AI4083 | 1000 | | | <200 |
| VP CH8000 | 100,000 | <35 | <60 | <200 |

Aqueous dispersions of PEDOT/PSS are commercially available from BAYER as BAYTRON™ P. The molar ratio in standard BAYTRON™ P analyzed by $^{13}C$ NMR analysis, as described in 2002 by P. Adriaensens et al. in Polymer, volume 43, pages 7003 to 7006, was found to be 2.7 (=weight ratio of 3.50) and that in standard aqueous dispersions of PEDOT/PSS commercialized by AGFA-GEVAERT N.V. was found to be 2.1 (=weight ratio of 2.72).

TABLE 1

| PEDOT type | Initial aromatic carbon atom intensity of PSS | Initial aliphatic carbon atom intensity of PSS | Average initial carbon atom intensity of PSS | Initial ether carbon atom intensity of PEDOT | PSS/PEDOT |
|---|---|---|---|---|---|
| BAYTRON ™ P Sample 1 | 445 | 454 | 449.5 | 164 | 2.7 |
| BAYTRON ™ P Sample 2 | 246 | 260 | 253 | 85 | 3.0 |
| AGFA-GEVAERT PSS/PEDOT dispersion | 446 | 493 | 470 | 226 | 2.1 |

In 1999, M. Lefebvre et al. in Chem. Materials, volume 11, pages 262-268, reported that the electrical conductivity of PEDOT/PSS prepared from aqueous and acetonitrile (AN) solutions of EDOT and NaPPS with PSS to PEDOT ratios ranging from 0.24 to 3.33 increased with decreasing PSS:PEDOT ratio as would be intuitively expected by one skilled in the art, due to the higher concentration of the intrinsically conductive component PEDOT.

| Solvent used | PSS:PEDOT ratio obtained | Initial conductivity [S cm$^{-1}$] |
|---|---|---|
| AN/water | 0.48 | 1.3 |
| AN/water | 0.67 | 1.0 |
| AN/water | 0.71 | 1.5 |
| AN/water | 0.91 | 0.3 |
| AN/water | 1.0 | 2.5 |
| AN/water | 3.33 | 6 × 10$^{-3}$ |
| water | 0.24 | 9.9 |
| water | 2.0 | 0.3 |
| water | 2.5 | 0.4 |

EP-A-686 662 discloses mixtures of A) neutral polythiophenes with the repeating structural unit of formula (I),

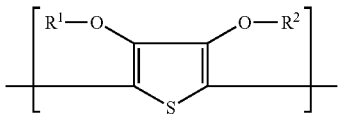

in which R$^1$ and R$^2$ independently of one another represent hydrogen or a C1-C4 alkyl group or together represent an optionally substituted C1-C4 alkylene residue, preferably an optionally with alkyl group substituted methylene, an optionally with C1-C12-alkyl or phenyl group substituted 1,2-ethylene residue or a 1,2-cyclohexene residue, and B) a di- or polyhydroxy- and/or carboxy groups or amide or lactam group containing organic compound; and conductive coatings therefrom which are tempered to increase their resistance preferably to <300 ohm/square. Furthermore, the examples in EP-A 686 662 disclose the polymerization of EDOT in the presence of poly(styrene sulphonic acid) at a weight ratio of 1:3.57 in water.

WO 03/001299A discloses a material for making an electroconductive pattern, said material comprising a support and a light-exposure differentiable element, characterized in that said light-exposure differentiable element comprises an outermost layer containing a polyanion and a polymer or copolymer of a substituted or unsubstituted thiophene, and optionally a second layer contiguous with said outermost layer; and wherein said outermost layer and/or said optional second layer contains a light-sensitive component capable upon exposure of changing the removability of the exposed parts of said outermost layer relative to the unexposed parts of said outermost layer. WO 03/001299A further discloses that conductivity enhancement refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant≧15, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 686 662 and EP-A 1 003 179. The PEDOT/PSS dispersion used in all the EXAMPLES of WO 03/001299A had a PEDOT:PSS weight ratio of 1:2.4 and had a narrow particle size distribution determined by CPS disc centrifuge measurements with a maximum at 25 nm and an average particle size of 30-50 nm.

EP-A 1 003 179 discloses a method for producing a polymeric conductive layer on an object comprising the steps of: providing an aqueous composition containing a polythiophene, a polyanion compound and an aprotic compound with a dielectric constant, ∈, ≧15; applying said composition to said object forming a layer; and drying said layer to form a conductive polymeric layer on said object, characterized in that said object and said layer are kept at a temperature below 100° C. and said conductive polymeric layer has a resistivity of at most 2 kΩ/square. Furthermore, the examples in EP 1 003 179 disclose the polymerization of EDOT in the presence of poly(styrene sulphonic acid) at a weight ratio of 1:2.46 in water.

Furthermore, in 2002 Kim et al. in Proceedings of SPIE, volume 4464, pages 85-92, reported a dramatic increase in conductivity of PEDOT/PSS without losing optical transparency by addition of a small amount of a polyalcohol, e.g. glycerol, in which BAYTRON™ P with a mean particle size in the range of 25 nm-75 nm was used as the starting material and Pettersson et al. in Organic Electronics, volume 3, pages 143-148, reported an increase in conductivity of PEDOT/PSS without losing transparency by addition of sorbitol in which the starting material was also BAYTRON™ P i.e. a weight ratio of PEDOT:PSS of 1:2.5.

A general drawback of conductive polymers which have been prepared and studied up to now, is that their conductivities are still too low for certain applications, their visible light transmittances are insufficiently high and/or they are not processable.

OBJECTS OF THE INVENTION

It is therefore an aspect of the present invention to provide 3,4-alkylenedioxy-thiophenes which upon polymerization provide poly(3,4-alkylenedioxy-thiophene)s, which upon oxidation or reduction exhibit high electrical conductivities, high visible light transmittances and/or good processability.

Further aspects and advantages of the invention will become apparent from the description hereinafter.

SUMMARY OF THE INVENTION

In unpublished European applicant nr. EP01000780 it was disclosed that the surface resistance of layers containing PEDOT/PSS decreased with decreasing oxygen concentration in the reaction medium with an optimum surface resistance being observed for PEDOT/PSS dispersions produced in a reaction medium containing less than 3 mg of oxygen/L of the reaction medium. Therefore, when investigating the influence of the preparation of PSS/PEDOT latexes upon the properties of layers prepared with such latexes, it is important to use PSS/PEDOT latexes prepared in reaction media containing similar concentrations of oxygen. Surprisingly it has been found that, at variance with the reports of M. Lefebvre et al. in 1999 in Chem. Materials, volume 11, pages 262-268, and Elschner et al. in 2001 at ASIA DISPLAY/IDW'01 held at Nagayo in Japan in October 2001 in paper OEL3-3, which reported a decrease in electrical conductivity with increasing PSS:PEDOT ratio, the surface resistance of layers prepared with aqueous dispersions of PEDOT/PSS latexes prepared in the presence of a particular concentration of oxygen in the reaction medium was found to decrease with increasing PSS:PEDOT ratio if particular additives, e.g. N-methyl-pyrrolidinone and polyhydroxy compounds such as diethylene glycol, were present in the dispersion. Although it is known from EP-A 0 686 662 and EP-A 1 003 179 that such additives enhance the conductivity of layers containing PSS/PEDOT latexes when layers are heated, it is totally unexpected that the conductivity enhancement will be greater for higher PSS/PEDOT ratios i.e. for lower concentrations of PEDOT.

Aspects of the present invention are realized by an aqueous dispersion of latex particles, said latex particles containing a polymer consisting of structural units including monomer units according to formula (I):

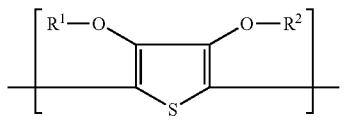
(I)

in which $R^1$ and $R^2$ independently of one another represent hydrogen or a $C_{1-5}$-alkyl group or together form an optionally substituted $C_{1-5}$-alkylene residue and at least one polyanion compound, said latex having a primary particle size of less than 40 nm and said dispersion contains an organic compound containing a di- or polyhydroxy- and/or carboxy groups or amide or lactam group or an aprotic compound with a dielectric constant, $\in, \geqq 15$, wherein said latex particles contain said at least one polyanion compound and said polymer in a weight ratio of at least 4.

Aspects of the present invention are also realized by a process for preparing an electroconductive coating comprising the steps of: preparing an aqueous solution or dispersion of a polymer consisting of structural units including monomer units according to formula (I):

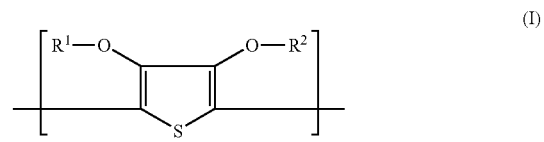
(I)

by polymerization with an initiator in a reaction medium in the presence of at least one polyanion compound under oxidizing or reducing conditions, wherein the weight ratio of the at least one polyanion compound to said structural units during the reaction is in the range of 4:1 to 20:1; preparing a first coating composition containing said polymer associated with said at least one polyanion compound and an organic compound containing a di- or polyhydroxy- and/or carboxy groups or amide or lactam group in a aqueous or non-aqueous medium; coating said first coating composition on an object thereby producing a first layer; and heating said first layer at a temperature of at least 100° C.

Aspects of the present invention are also realized by a process for preparing an electroconductive coating comprising the steps of: preparing an aqueous solution or dispersion of a polymer consisting of structural units including monomer units according to formula (I):

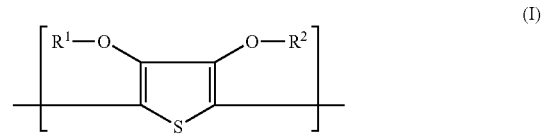
(I)

by polymerization with an initiator in a reaction medium in the presence of at least one polyanion compound under oxidizing or reducing conditions, wherein the weight ratio of said at least one polyanion compound to said structural units during the reaction is in the range of 4:1 to 20:1; preparing a second coating composition containing said polymer associated with said at least one polyanion compound and an aprotic compound with a dielectric constant, $\in, \geqq 15$ in an aqueous or non-aqueous medium; coating said second coating composition on an object thereby producing a second layer; and heating said second layer at a temperature of at least 50° C.

Aspects of the present invention are also realized by a process for preparing an electroconductive coating comprising the steps of: preparing an aqueous solution or dispersion of a polymer containing structural units according to formula (I):

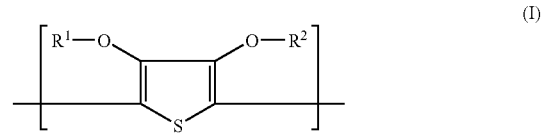
(I)

by polymerization with an initiator in a reaction medium in the presence of polyanions under oxidizing or reducing conditions, wherein the molar ratio of said structural units according to formula (I) to anionic groups in the polyanion during the reaction is in the range of 4:1 to 10:1; preparing a first coating composition containing said polymer associated with said polyanions and an organic compound containing a di- or polyhydroxy- and/or carboxy groups or amide or lactam group in a aqueous or non-aqueous medium; coating said first coating composition on an object thereby producing a first layer; and heating said first layer at a temperature of at least 100° C.

Aspects of the present invention are also realized by a process for preparing an electroconductive coating comprising the steps of: preparing an aqueous solution or dispersion of a polymer containing structural units according to formula (I):

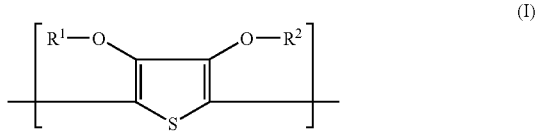

by polymerization with an initiator in a reaction medium in the presence of polyanions under oxidizing or reducing conditions, wherein the molar ratio of said structural units according to formula (I) to anionic groups in the polyanion during the reaction is in the range of 4:1 to 10:1; preparing a second coating composition containing said polymer associated with said polyanions and an aprotic compound with a dielectric constant, $\in$, $\geqq 15$ in an aqueous or non-aqueous medium; coating said second coating composition on an object thereby producing a second layer; and heating said second layer at a temperature of at least 50° C.

Preferred embodiments of the present invention are disclosed in the detailed description of the invention.

DETAILED DESCRIPTION OF THE INVENTION

Definitions

It should be noted that as used in the specification and the appended claims, the singular forms "a" and "an" include plural references unless the context clearly dictates otherwise. Thus, for example, reference to "a thiophene according to formula (I)" includes more than one such thiophene, reference to polymerization of "a thiophene according to formula (I)" includes copolymerization of more than one such thiophene.

The term polymer includes homopolymers, copolymers, terpolymers, graft polymers and block copolymers and both chain and condensation polymers.

The term $C_{1-5}$-alkylene group represents methylenedioxy, 1,2-ethylenedioxy, 1,3-propylenedioxy, 1,4-butylenedioxy and 1,5-pentylenedioxy groups.

The term initiator means a species capable of initiating polymerization.

The term alkyl means all variants possible for each number of carbon atoms in the alkyl group i.e. for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl etc.

The term aqueous medium for the purposes of the present invention means a liquid containing at least 60% by volume of water, preferably at least 80% by volume of water, and optionally containing water-miscible organic solvents such as alcohols e.g. methanol, ethanol, 2-propanol, butanol, iso-amyl alcohol, octanol, cetyl alcohol etc.; glycols e.g. ethylene glycol; glycerine; N-methyl pyrrolidinone; methoxypropanol; and ketones e.g. 2-propanone and 2-butanone etc.

The term non-aqueous medium for the purposes of the present invention means all liquids not included in the term aqueous medium.

The term electroconductive means having a surface resistance below $10^6$ Ω/square.

The term "conductivity enhancement" refers to a process in which the conductivity is enhanced e.g. by contact with high boiling point liquids such as di- or polyhydroxy- and/or carboxy groups or amide or lactam group containing organic compound optionally followed by heating at elevated temperature, preferably between 100 and 250° C., during preferably 1 to 90 seconds, results in conductivity increase. Alternatively in the case of aprotic compounds with a dielectric constant$\geqq 15$, e.g. N-methyl-pyrrolidinone, temperatures below 100° C. can be used. Such conductivity enhancement is observed with polythiophenes and can take place during the preparation of the outermost layer or subsequently. Particularly preferred liquids for such treatment are N-methyl-pyrrolidinone and diethylene glycol such as disclosed in EP-A 0 686 662 and EP-A 1 003 179.

PEDOT as used in the present disclosure represents poly (3,4-ethylenedioxythiophene).

EDOT as used in the present disclosure represents 3,4-ethylenedioxythiophene.

ADOT as used in the present disclosure represents 3,4-alkylenedioxythiophene).

PSS as used in the present disclosure represents poly(styrenesulphonic acid) or poly(styrenesulphonate).

PET as used in the present disclosure represents poly(ethylene terephthalate).

Aqueous Dispersion of a Latex

According to a first embodiment of an aqueous dispersion of a latex, according to the present invention, said latex has a primary particle size of less than 30 nm.

According to a second embodiment of an aqueous dispersion of a latex, according to the present invention, the weight ratio of said at least one polyanion compound to said polymer corresponds to the weight ratio of said structural units to said at least one polyanion compound during the preparation thereof.

According to a third embodiment of an aqueous dispersion of a latex, according to the present invention, said latex particles contain said at least one polyanion compound and said polymer in a weight ratio of greater than 4 and less than 20.

According to a fourth embodiment of the aqueous dispersion of a latex, according to the present invention, wherein said latex is prepared in a reaction medium with less than 8500 mg of oxygen/L of said reaction medium when the initiator is added.

According to a fifth embodiment of the aqueous dispersion of a latex, according to the present invention, wherein said latex is prepared in a reaction medium with less than 2000 mg of oxygen/L of said reaction medium when the initiator is added.

According to a sixth embodiment of the aqueous dispersion of a latex, according to the present invention, wherein said latex is prepared in a reaction medium with less than 1000 mg of oxygen/L of said reaction medium when the initiator is added.

According to a seventh embodiment of the aqueous dispersion of a latex, according to the present invention, wherein said latex is prepared in a reaction medium with less than 500 mg of oxygen/L of said reaction medium when the initiator is added.

According to an eighth embodiment of the aqueous dispersion of a latex, according to the present invention, wherein said latex is prepared in a reaction medium with less than 100 mg of oxygen/L of said reaction medium when the initiator is added.

According to a ninth embodiment of the aqueous dispersion of a latex, according to the present invention, wherein said latex is prepared in a reaction medium with less than 3 mg of oxygen/L of said reaction medium when the initiator is added.

According to a tenth embodiment of the aqueous dispersion of a latex, according to the present invention, wherein said latex is prepared in a reaction medium with less than 1.5 mg of oxygen/L of said reaction medium when the initiator is added.

According to an eleventh embodiment of the aqueous dispersion of a latex, according to the present invention, wherein said latex is prepared in a reaction medium with less than 0.5 mg of oxygen/L of said reaction medium when the initiator is added.

According to a twelfth embodiment of the aqueous dispersion of a latex, according to the present invention, the monomer units according to formula (I) are selected from the group consisting of optionally alkyl group-substituted 3,4-methylenedioxy-thiophene units, optionally alkyl or aryl-group-substituted 3,4-ethylenedioxythiophene units, optionally alkyl or aryl-group-substituted 3,4-ethylenedioxythiophene units, a unit according to formula (I) in which $R^1$ and $R^2$ are together a 1,2-cyclohexene group, optionally alkyl or aryl-group-substituted 3,4-propylenedioxythiophene units, optionally alkyl or aryl-group-substituted 3,4-butylenedioxythiophene units and optionally alkyl or aryl-group-substituted 3,4-pentylenedioxythiophene units.

According to a thirteenth embodiment of the aqueous dispersion of a latex, according to the present invention, the polymer is a copolymer of at least one 3,4-alkylenedioxythiophene compound with a solubility in water at 25° C. of less than 2.2 g/L with at least one 3,4-alkylenedioxythiophene compound with a solubility in water at 25° C. of at least 2.2 g/L.

According to a fourteenth embodiment of the aqueous dispersion of a latex, according to the present invention, the polymer is a copolymer of at least one 3,4-alkylenedioxythiophene compound with a solubility in water at 25° C. of less than 2.2 g/L with at least one 3,4-alkylene-dioxythiophene compound with a solubility in water at 25° C. of at least 2.2 g/L and the 3,4-alkylenedioxy-thiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

Process for Preparing an Aqueous Solution or Dispersion of a Polymer Containing Monomer Units According to Formula (I)

A step in the processes, according to the present invention, is the preparation of an aqueous solution or dispersion of a polymer consisting of structural units including monomer units according to formula (I):

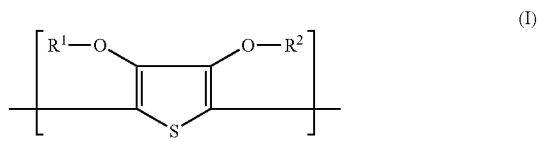

by polymerization with an initiator in a reaction medium in the presence of at least one polyanion compound under oxidizing or reducing conditions, wherein the weight ratio of the at least one polyanion compound to the structural units during the reaction is in the range of 5:1 to 20:1.

According to a first embodiment of the processes, according to the present invention, the molar ratio of polymer or copolymer of (3,4-dialkoxythiophene) to at least one polyanion compound in the solution or dispersion is in the range of 1:5 to 1:8.0.

According to a second embodiment of the processes, according to the present invention, said monomer units according to formula (I) are present in a concentration of 60 mM or less in said reaction medium.

The concentration of oxygen in the reaction medium can be regulated by any means e.g. freeze-thaw techniques, prolonged bubbling of an inert gas such as argon, nitrogen or helium through the reaction medium, consumption of oxygen in a sacrificial reaction under an inert gas blanket.

According to a third embodiment of the processes, according to the present invention, the inert atmosphere is a nitrogen, helium or argon atmosphere.

The oxidation agents used for the oxidative polymerisation of pyrrole, such as described for example in Journal of the American Chemical Society, volume 85, pages 454-458 (1963) and J. Polymer Science Part A Polymer Chemistry, volume 26, pages 1287-1294 (1988), can be utilized for the oxidative polymerization of thiophenes.

According to a fourth embodiment of the processes, according to the present invention, the polymerization is oxidative and the inexpensive and easily accessible oxidation agents used for initiating the polymerization are selected from the group consisting of iron(III) salts such as $FeCl_3$, the iron(III) salts of organic acids, e.g. $Fe(OTs)_3$, $H_2O_2$, $K_2Cr_2O_7$, alkali and ammonium persulphates, alkali perborates and potassium permanganate.

Theoretically the oxidative polymerization of thiophenes requires 2.25 equivalents of oxidation agent per mole thiophene of formula (I) [see e.g. J. Polymer Science Part A Polymer Chemistry, volume 26, pages 1287-1294 (1988)]. In practice an excess of 0.1 to 2 equivalents of oxidation agent is used per polymerizable unit. The use of persulphates and iron(III) salts has the great technical advantage that they do not act corrosively. Furthermore, in the presence of particular additives oxidative polymerization of the thiophene compounds according to formula (I) proceeds so slowly that the thiophenes and oxidation agent can be brought together as a solution or paste and applied to the substrate to be treated. After application of such solutions or pastes the oxidative polymerization can be accelerated by heating the coated substrate as disclosed in U.S. Pat. No. 6,001,281 and WO 00/14139 herein incorporated by reference.

Reductive polymerization can be performed using the Stille (organotin) or Suzuki (organoboron) routes described in 2,002 by Appperloo et al. in Chem. Eur. Journal, volume 8, pages 2384-2396, and as disclosed in 2001 in Tetrahedron Letters, volume 42, pages 155-157 and in 1998 in Macromolecules, volume 31, pages 2047-2056 respectively or with nickel complexes as disclosed in 1999 in Bull. Chem. Soc.

Japan, volume 72, page 621 and in 1998 in Advanced materials, volume 10, pages 93-116.

Polymers containing monomer units according to formula (I) may also be prepared by chemically copolymerizing monomer units according to formula (I) with other polymerizable heterocyclic compounds such as pyrrole.

Oxygen Measurements

The oxygen concentration can be measured with a Knick Process Unit 73 $O_2$, using InPro 6000 Series $O_2$ sensors, available from Mettler Toledo. These sensors are based on a polarographic oxygen measurement. The Clark polarographic sensor consists basically of a working electrode (cathode), a counter/reference electrode (anode), and an oxygen-permeable membrane that separates the electrodes from the medium. The transmitter supplies a constant polarization voltage to the cathode, needed to reduce oxygen. The oxygen molecules that migrate through the membrane are reduced at the cathode. At the same time oxidation takes place at the anode and oxidized anode metal (silver) is liberated into the electrolyte. The electrolyte closes the electric circuit between the anode and the cathode (ion conductivity). The current, produced in this way, is measured by the transmitter and is proportional to the partial pressure of oxygen ($O_2$) in the sample medium.

The amount of oxygen in an aqueous 6 wt % aqueous solution of poly(styrenesulphonic acid) determined via this technique is 6.5 mg/L.

A poly(styrenesulphonic acid) solution at 25° C. and 1013 mbar saturated with oxygen by bubbling oxygen through it has an oxygen content of 38,45 mg/L. This value may be regarded as the max solubility of oxygen in a poly(styrenesulphonic acid) solution at 25° C. and 1013 mbar.

Electrochemical Polymerization of Polymers Containing Monomer Units according to Formula (I)

Polymers containing monomer units according to formula (I) can be prepared by electrochemical polymerization. Electrochemical oxidative polymerization of thiophene compounds according to formula (I) carried out at temperatures from −78° C. to the boiling point of the solvent employed, temperatures between −20° C. and 60° C. is preferred. The reaction time, depending upon the particular thiophene, is generally between a few seconds and several hours. Electrochemical polymerization of thiophene compounds was described in 1994 by Dietrich et al. in Journal Electroanalytical Chemistry, volume 369, pages 87-92.

Inert liquids suitable for use during electrochemical oxidation of thiophene compounds according to formula (I) are: water, alcohols such as methanol and ethanol, ketones such as acetophenone, halogenated hydrocarbons such as methylene chloride, chloroform, tetrachloromethane and fluorohydrocarbons, esters such as ethyl acetate and butyl acetate, aromatic hydrocarbons such as benzene, toluene and xylene, aliphatic hydrocarbons such as pentane, hexane, heptane and cyclohexane, nitriles such as acetonitrile and benzonitrile, sulfoxides such as dimethylsulfoxide, sulfones such as dimethylsulfone, phenylmethylsulfone and sulfolan, liquid aliphatic amides such as methyl acetamide, dimethyl acetamide, dimethyl formamide, pyrrolidone, N-methyl-pyrrolidone, caprolactam, N-methyl-caprolactam, aliphatic and mixed aliphatic and aromatic ethers such as diethylether and anisole, liquid ureas such as tetramethylurea or N,N-dimethyl-imidazolidinone.

Electrolyte additives for use in the electrochemical polymerization of thiophene compounds according to formula (I) are preferably free acids or the usual conducting salts, which exhibit a certain solubility in the solvent used. Particularly suitable electrolytes are alkali, alkaline earth or optionally alkylated ammonium, phosphonium, sulfonium or oxonium cations in combination with perchlorate, tosylate, tetrafluoroborate or hexafluorophosphonate anions.

The electrolyte additives are used in such quantities, that a current of at least 0.1 mA flows during electrochemical oxidation.

Electrochemical polymerization can be carried out continuously or discontinuously. Known electrode materials are ITO-covered glass, precious metal or steel mesh, carbon-filled polymers, evaporated metal-coated insulator layers and carbon felt.

Current densities during electrochemical oxidation may vary within wide limits. According to an eighth embodiment of the present invention the current densities is 0.0001 to 100 $mA/cm^2$. According to a ninth embodiment of the present invention the current density is 0.01 to 40 $mA/cm^2$. At these current densities voltages of ca. 0.1 to 50 V are set up.

Polymers containing monomer units according to formula (I) may also be prepared by electrochemically copolymerizing monomer units according to formula (I) with other polymerizable heterocyclic compounds such as pyrrole.

Polyanion Compound

The polyanion compounds for use in the dispersion according to the present invention are disclosed in EP-A 440 957 and include polymeric carboxylic acids, e.g. polyacrylic acids, polymethacrylic acids, or polymaleic acids and polysulphonic acids, e.g. poly(styrene sulphonic acid). These polycarboxylic acids and polysulphonic acids can also be copolymers of vinylcarboxylic acids and vinylsulphonic acids with other polymerizable monomers, e.g. acrylic acid esters, methacrylic acid esters and styrene.

According to a sixteenth embodiment of the aqueous dispersion of a latex, according to the present invention, the at least one polyanion compound includes polystyrene sulphonic acid.

INDUSTRIAL APPLICATION

Chemically or electrochemically prepared polymers containing monomer units according to formula (I) exhibit high electrical conductivity together with low absorption of visible light and high absorption to infrared radiation. Therefore layers thereof are highly electrically conducting, highly transparent to visible light and heat shielding. Such polythiophenes can be applied to a wide variety of rigid and flexible substrates, e.g. ceramics, glass and plastics, and are particularly suitable for flexible substrates such as plastic sheeting and the substrates can be substantially bent and deformed without the polythiophene layer losing its electrical conductivity.

Such polythiophenes can therefore be utilized in photovoltaic devices, batteries, capacitors and organic and inorganic electroluminescent devices, in electromagnetic shielding layers, in heat shielding layers, in antistatic coatings for a wide variety of products including photographic film, thermographic recording materials and photothermographic recording materials, in smart windows, in electrochromic devices, in sensors for organic and bio-organic materials, in field effect transistors, in printing plates, in conductive resin adhesives and in free-standing electrically conductive films [see also chapter 10 of the Handbook of Oligo- and Polythiophenes, Edited by D. Fichou, Wiley-VCH, Weinheim (1999)].

The invention is illustrated hereinafter by way of comparative and invention examples. The percentages and ratios given in these examples are by weight unless otherwise indicated. Subbing layer Nr. 01 used in the EXAMPLES has the composition:

| | |
|---|---|
| copolymer of 88% vinylidene chloride, 10% methyl acrylate and 2% itaconic acid | 79.1% |
| Kieselsol ® 100F, a colloidal silica from BAYER | 18.6% |
| Mersolat ® H, a surfactant from BAYER | 0.4% |
| Ultravon ® W, a surfactant from CIBA-GEIGY | 1.9% |

Preparation of
3,4-Alkylenedioxythioehene-Polymers

Examples 1

The quantity of poly(styrene sulphonic acid)[PSS] (Mw=290,000) solution given in Table 2 was mixed with the quantity of deionized water given for the particular PEDOT-type in Table 2 at 25° C. in the appropriate reaction vessel equipped with a stirrer and a nitrogen inlet. After bubbling nitrogen through this mixture for 30 minutes, the quantity of EDOT for the particular PEDOT-type given in Table 2 was then added to this solution. The concentration of oxygen in this solution as measured with a Knick Process Unit 73 $O_2$, using InPro 6000 Series $O_2$ is given in Table 2. The quantities of $Fe_2(SO_4)_3 \cdot 9H_2O$ and $Na_2S_2O_8$ corresponding to concentrations of 0.13 and 41.6 mM respectively were then added to initiate the polymerization reaction. The concentration of EDOT in the reaction mixtures was 30 mM and that of PSS was 57 mM. The reaction mixtures were then stirred at 25° C. for 7 h, after which a further quantity of $Na_2S_2O_8$ for the particular PEDOT-type was added corresponding to a concentration of 6.95 mM. After an additional reaction time of 16 h the reaction mixtures were treated twice with ion exchanger (300 mL Lewatit™ S100MB+500 mL Lewatit™ M600MB). The resulting mixtures were further thermally treated at 95° C. for 2 h and the resulting viscous mixture treated with high shear [microfluidizer at 60 MPa (600 Bar)].

Preparing Electroconductive Layers of Type 1 with Dispersions based on the Dispersions of Example 1

Coating dispersions were produced by adding 3-glycidoxypropyl-trimethoxysilane, ZONYL® FSO100, a copolymer latex of vinylidene chloride, methacrylate and itaconic acid (88/10/2) and N-methyl pyrrolidinone to the dispersions of EXAMPLE 1 so as to produce layers of type 1, upon doctor blade-coating onto a subbed 175 μm poly(ethylene terephthalate) support and drying at 45° C. for 3.5 minutes, with the following composition:

| | |
|---|---|
| PEDOT)/PSS | 100 mg/m² |
| [PEDOT | 28.9 mg/m²] |
| ZONYL ® FSO100 | 8 mg/m² |
| 3-glycidoxypropyl-trimethoxysilane | 100 mg/m² |
| Copolymer latex of vinylidene chloride, methacrylate and itaconic acid (88/10/2) | 100 mg/m² |
| N-methyl pyrrolidinone | 2 mL/m² |

Characterization of Electroconductive Layers
Prepared with Dispersions Based on the Dispersions
of Example 1

The optical density of the layers was determined by measuring a stack of 10 strips with a Macbeth® TD904 densitometer using a visible filter and then obtaining therefrom the optical density of a single strip. The values given in Table 3 include the optical density of the PET-support.

The surface resistance of the layers was measured in a room conditioned to a temperature of 25° C. and 30% relative humidity by contacting the printed layer with parallel copper electrodes each 35 mm long and 35 mm apart capable of forming line contacts, the electrodes being separated by a Teflon® insulator. This enabled a direct measurement of the surface resistance to be realized. The results are also summarized in Table 3.

TABLE 2

| PEDOT type | quantity of O₂ in reaction medium [mg/L] | EDOT weight [g] | PSS 5.6 wt % solution [g] | PSS final concentration [mM] | Fe₂(SO₄)₃•9H₂O weight [g] | Na₂S₂O₈ initially added [g] | Na₂S₂O₈ added after 7 h [g] | Water weight [g] |
|---|---|---|---|---|---|---|---|---|
| 1 | 0.080 | 213 | 10649* | 57 | 3.75 | 428.2 | 71.6 | 39531 |
| 2 | 0.995 | 213 | 11218# | 57 | 3.75 | 428.2 | 71.6 | 38782 |
| 3 | 0.995 | 213 | 11218# | 57 | 3.75 | 428.2 | 71.6 | 38782 |
| 4 | 6.5 | 12.78 | 562.5 | 57 | 0.225 | 25.7 | 4.3 | 2437.5 |
| 5 | 8.36 | 12.78 | 562.5 | 57 | 0.225 | 25.7 | 4.3 | 2437.5 |
| 6 | 38.45 | 12.78 | 562.5 | 57 | 0.225 | 25.7 | 4.3 | 2437.5 |

*4.93 wt % aqueous PSS solution

4.68 wt % aqueous PSS solution

TABLE 3

| PEDOT-type | quantity of PEDOT/PSS dispersion [g] | quantity of $O_2$ in reaction medium [mg/L] | PEDOT/PSS concentration [wt %] | Initial surface resistance [Ω/square] | O.D. with PET support |
|---|---|---|---|---|---|
| 1 | 90,000 | 0.080 | 0.82 | 1500 | |
| 2 | 95,844 | 0.995 | 0.77 | 2010 | |
| 3 | 91,111 | 0.995 | 0.81 | 1830 | |
| 4 | 1800 | 6.5 | 1.09 | 2900 | 0.067 |
| 5 | 1535 | 8.36 | 0.82 | 4120 | |
| 6 | 1760 | 38.45 | 1.11 | 21000 | 0.066 |

The results in Table 3 show that the surface resistance of the PEDOT/PSS-layers with a molar PSS:PEDOT ratio of 1.90 strongly increased with increasing oxygen concentration in the reaction medium.

Example 2

The quantity of poly(styrene sulphonic acid)[PSS] (Mw=290,000) solution given in Table 4 was mixed with the quantity of deionized water given for the particular PEDOT-type in Table 4 at 25° C. in the appropriate reaction vessel equipped with a stirrer and a nitrogen inlet. After bubbling nitrogen through this mixture for 30 minutes, the quantity of EDOT for the particular PEDOT-type given in Table 4 was then added to this solution. The concentration of oxygen in this solution was <1.0 mg/L as measured with a Knick Process Unit 73 $O_2$, using InPro 6000 Series $O_2$. The quantities of $Fe_2(SO_4)_3 \cdot 9H_2O$ and $Na_2S_2O_8$ corresponding to concentrations of 0.13 and 41.6 mM respectively were then added to initiate the polymerization reaction. The concentration of EDOT in the reaction mixtures was 30 mM and that of PSS was 57 mM. The reaction mixtures were then stirred at 25° C. for 7 h, after which a further quantity of $Na_2S_2O_8$ for the particular PEDOT-type was added corresponding to a concentration of 6.95 mM. After an additional reaction time of 16 h the reaction mixtures were treated twice with ion exchanger (300 mL Lewatit™ S100 MB+500 mL Lewatit™ M600MB). The resulting mixtures were further thermally treated at 95° C. for 2 h and the resulting viscous mixture treated with high shear [microfluidizer at 60 MPa (600 Bar)].

characterized as described for the dispersions of EXAMPLE 1. The results are summarized in Table 5. Table 5:

TABLE 5

| PEDOT type | quantity of PEDOT/PSS dispersion [g] | PEDOT/PSS concentration [wt %] | surface resistance [Ohm/square] | O.D. |
|---|---|---|---|---|
| 7 | 1950 | 1.02 | 1200 | 0.066 |
| 8 | 1840 | 1.03 | 1200 | 0.065 |

The results in Tables 3 and 5 taken together show that the initial surface resistance of the PEDOT/PSS-layers is strongly dependent upon the quantity of oxygen in the reaction medium during the polymerization of 3,4-ethylenedioxythiophene in the presence of poly(styrenesulphonic acid), the lower the concentration of oxygen in the reaction medium the lower the surface resistance.

Example 3

The quantity of poly(styrene sulphonic acid)[PSS] (Mw=290,000) solution given in Table 6 was mixed with the quantity of deionized water given for the particular PEDOT-type in Table 6 at 25° C. in the appropriate reaction vessel equipped with a stirrer and a nitrogen inlet. After bubbling nitrogen through this mixture for 30 minutes, the quantity of EDOT for the particular PEDOT-type given in Table 7 was then added to this solution, giving a EDOT-concentration of 30 mM. The concentration of oxygen in this solution was <1.0 mg/L as measured with a Knick Process Unit 73 $O_2$, using InPro 6000 Series $O_2$. The quantities of $Fe_2(SO_4)_3 \cdot 9H_2O$ and $Na_2S_2O_8$ corresponding to concentrations of 0.13 and 41.6 mM respectively were then added to initiate the polymerization reaction. The concentration of EDOT in the reaction mixtures was 30 mM and that of PSS is given for the particular PEDOT-type in Table 6.

The reaction mixtures were then stirred at 25° C. for 7 h, after which a further quantity of $Na_2S_2O_8$ for the particular PEDOT-type was added corresponding to a concentration of

TABLE 4

| PEDOT Type | EDOT weight [g] | PSS weight of 5.99 wt % solution [g] | PSS final concentration [mM] | $Fe_2(SO_4)_3 \cdot 9H_2O$ weight [g] | $Na_2S_2O_8$ initially added [g] | $Na_2S_2O_8$ added after 7 h [g] | Water weight [g] |
|---|---|---|---|---|---|---|---|
| 7 | 12.78 | 438.23 | 57 | 0.225 | 25.7 | 4.3 | 2061.77 |
| 8 | 12.78 | 438.23 | 57 | 0.225 | 25.7 | 4.3 | 2061.77 |

Preparation and Characterization of Electroconductive Layers of Type 1 with Dispersions Based on the Dispersions of Example 2

The electroconductive layers of type 1 with dispersions based on the dispersions of EXAMPLE 2 were prepared and 6.95 mM. After an additional reaction time of 16 h the reaction mixtures were treated twice with ion exchanger (300 mL Lewatit™ S100MB+500 mL Lewatit™ M600MB). The resulting mixtures were further thermally treated at 95° C. for 2 h and the resulting viscous mixture treated with high shear [microfluidizer at 60 MPa (600 Bar)].

TABLE 6

| PEDOT type | EDOT weight [g] | PSS weight of 4.81 wt % solution [g] | PSS final concentration [mM] | $Fe_2(SO_4)_3 \cdot 9H_2O$ weight [g] | $Na_2S_2O_8$ initially added [g] | $Na_2S_2O_8$ added after 7 h [g] | Water weight [g] |
|---|---|---|---|---|---|---|---|
| 9 | 10.65 | 219.13 | 23 | 0.187 | 21.4 | 3.58 | 2280.87 |
| 10 | 10.65 | 219.13 | 23 | 0.187 | 21.4 | 3.58 | 2280.87 |
| 11 | 10.65 | 347.75 | 36 | 0.187 | 21.4 | 3.58 | 2152.25 |
| 12 | 10.65 | 347.75 | 36 | 0.187 | 21.4 | 3.58 | 2152.25 |
| 13 | 42.60 | 1752.25 | 46 | 0.748 | 85.64 | 14.32 | 8247.08 |
| 14 | 213 | 525** | 57 | 3.75 | 428.2 | 71.6 | 39531 |
| 15 | 213 | 525** | 57 | 3.75 | 428.2 | 71.6 | 39531 |
| 16 | 213 | 525** | 57 | 3.75 | 428.2 | 71.6 | 39531 |
| 17 | 10.65 | 711.18 | 74 | 0.187 | 21.4 | 3.58 | 1788.2 |
| 18 | 10.65 | 711.18 | 74 | 0.187 | 21.4 | 3.58 | 1788.2 |
| 19 | 8.52 | 1137.89 | 149 | 0.149 | 17.1 | 2.86 | 862.11 |
| 20 | 8.52 | 1137.89 | 149 | 0.149 | 17.1 | 2.86 | 862.11 |
| 21 | 213 | 27907.3# | 149 | 3.75 | 428.2 | 71.6 | 22092.7 |
| 22 | 213 | 27907.3# | 149 | 3.75 | 428.2 | 71.6 | 22092.7 |
| 23 | 213 | 27907.3# | 149 | 3.75 | 428.2 | 71.6 | 22092.7 |

*same conditions as for PEDOT type 17 except that no thermal treatment at 95° C. for 2 h was carried out
4.90 wt % aqueous solution of PSS
**4.93 wt % aqueous solution of PSS The resulting PSS:PEDOT weight and molar ratios, PEDOT/PSS-concentrations, viscosity as measured in an Ubbelohde viscometer in a bath thermostatted at 25° C., the peak particle sizes in the bimodal size distribution and the number of particles per mL with a particle size greater than 1 μm are given in Table 7.

TABLE 7

| PEDOT type | PSS/PEDOT weight ratio | PSS/PEDOT molar ratio | PEDOT/PSS-conc [% by wt] | viscosity cP | Peak particle size after homogenization [nm] | # part/ mL > 1 μm |
|---|---|---|---|---|---|---|
| 9 | 0.98 | 0.76 | 0.73 | 226 | 47 | $4.7 \times 10^7$ |
| 10 | 0.98 | 0.76 | 0.65 | 120 | 45 | $1.6 \times 10^7$ |
| 11 | 1.55 | 1.20 | 0.86 | 225 | 44 | $1.7 \times 10^7$ |
| 12 | 1.55 | 1.20 | 0.82 | 150 | 42 | $2 \times 10^7$ |
| 13 | 1.98 | 1.53 | 0.81 | 45 | 31 | $8.3 \times 10^6$ |
| 14 | 2.46 | 1.90 | — | 56 | 25 | $7.6 \times 10^6$ |
| 15 | 2.46 | 1.90 | — | 24 | — | — |
| 16 | 2.46 | 1.90 | — | 28 | — | — |
| 17 | 3.18 | 2.45 | 1 | 64 | 33 | $3.6 \times 10^7$ |
| 18 | 3.18 | 2.45 | 0.93 | 60 | 32 | $3.2 \times 10^7$ |
| 19 | 6.36 | 4.91 | 1.83 | 94 | 27 | $2.9 \times 10^7$ |
| 20 | 6.36 | 4.91 | 1.89 | 118 | 26 | $3.3 \times 10^7$ |
| 21 | 6.42 (50L) | 4.96 | 1.55 | 59 | 26 | $1.1 \times 10^6$ |
| 22 | 6.42 (50L-UT) | 4.96 | 1.66 | 53 | 23 | $1.2 \times 10^6$ |
| 23 | no thermal treatment | 4.96 | 1.32 | 59 | 18 | $1.5 \times 10^6$ |

Aqueous gel permeation chromatography using UV-vis absorption detection was used to determine the relative quantity of PSS, bound or unbound, as the area of the peak at 254 nm, $A_{254}$, and the relative quantity of bound PEDOT, otherwise no transport could take place and the PEDOT could not be detected, as the area of the peak at 785 nm, $A_{785}$. $A_{254}/A_{785}$ gives the relative molar quantity of PSS to the bound PEDOT. In order to obtain representative results it was necessary to microfluidize the dispersions at 60 MPa (600 bar) prior to running the GPC. If this was not done the PEDOT-peak was very small due to the agglomerated latex being unable to be transported through the column. The molecular weight of the PEDOT relative to sodium poly(styrene sulphonate) standards was determined at the same time. The results are summarized in Table 8.

The relative PSS/PEDOT ratio from GPC measurements is clearly correlatable with the actual molar ratio present, thereby indicating that the PSS is substantially bound to the PEDOT.

which the quantities of ZONYL® FSO100, 3-glycidoxypropyl-trimethoxysilane, copolymer latex and N-methylpyrrolidinone were held constant and the quantity of latex varied to yield a constant coverage of PEDOT [28.9 mg/m². These layers were characterized as described for the dispersions of EXAMPLE 1 and the results are given in Table 9.

The results in Table 9 surprisingly show that the surface resistance decreased with increasing PSS:PEDOT ratio for layers containing PEDOT/PSS produced in the substantial absence of oxygen, according to the present invention. This is at variance with the data available in the literature for PEDOT/PSS which shows that the surface resistance increases with increasing PSS:PEDOT ratio, see, for example, the paper published in 1999 by M. Lefebvre et al. in Chem. Mater., volume 11, pages 262-268, as mentioned above.

TABLE 8

| PEDOT type | PSS/PEDOT weight ratio | PSS/PEDOT molar ratio | PEDOT $M_n$ | PEDOT $M_w$ | $A_{254}$ | $A_{785}$ | Relative PSS/PEDOT molar ratio $A_{254}/A_{785}$ |
|---|---|---|---|---|---|---|---|
| 9  | 0.98 | 0.76 | $1.2 \times 10^5$ | $2.9 \times 10^5$ | 0.0019 | 0.0008 | 2.38 |
| 11 | 1.55 | 1.20 | $4.5 \times 10^5$ | $7.2 \times 10^5$ | 0.0032 | 0.0013 | 2.46 |
| 12 | 1.55 | 1.20 | $4.4 \times 10^5$ | $7.6 \times 10^5$ | 0.0031 | 0.0014 | 2.21 |
| 13 | 1.98 | 1.53 | $2.0 \times 10^5$ | $4.9 \times 10^5$ | 0.0049 | 0.0031 | 1.58 |
| 17 | 3.18 | 2.45 | $2.8 \times 10^5$ | $7.9 \times 10^5$ | 0.0073 | 0.0025 | 2.92 |
| 18 | 3.18 | 2.45 | $3.0 \times 10^5$ | $8.9 \times 10^5$ | 0.0066 | 0.0024 | 2.75 |
| 19 | 6.36 | 4.91 | $4.9 \times 10^5$ | $9.5 \times 10^5$ | 0.0156 | 0.0029 | 5.38 |
| 20 | 6.36 | 4.91 | $4.9 \times 10^5$ | $9.1 \times 10^5$ | 0.0161 | 0.0023 | 7.0 |

Preparation and Characterization of Electroconductive Layers of Type 1 with Dispersions Based on the Dispersions of Example 3

The electroconductive layers of type 1 with dispersions based on the dispersions of EXAMPLE 3 were prepared in

TABLE 9

| PEDOT type | Coverage of total layer [mg/m²] | wt % of PEDOT in layer | PSSA/PEDOT weight ratio | surface resistance [Ohm/square] | OD excl. PET support | OD with PET support |
|---|---|---|---|---|---|---|
| 9  | 265.5 | 10.9 | 0.99 | 3000 | — | 0.061 |
| 10 | 265.5 | 10.9 | 0.99 | 3300; 3680 | 0.028 | 0.062 |
| 11 | 282.3 | 10.2 | 1.57 | 1700 | — | 0.065 |
| 12 | 282.3 | 10.2 | 1.57 | 1600; 1710 | 0.031 | 0.065 |
| 13 | 294.1 | 9.8 | 1.98 | 1800 | — | — |
| 14 | 308 | 9.4 | 2.46 | 1500; 2010 | 0.027 | — |
| 15 | 308 | 9.4 | 2.46 | 2010 | 0.028 | — |
| 16 | 308 | 9.4 | 2.46 | 1830 | 0.028 | — |
| 17 | 329.7 | 8.8 | 3.21 | 870; 1000 | 0.028 | 0.063 |
| 18 | 329.7 | 8.8 | 3.21 | 770 | — | 0.065 |
| 19 | 422.4 | 6.8 | 6.42 | 730 | — | 0.064 |
| 20 | 422.4 | 6.8 | 6.42 | 720 | — | 0.065 |
| 21 | 422.4 | 6.8 | 6.42 (50L) | 640 | — | 0.066 |
| 22 | 422.4 | 6.8 | 6.42 (50L-UT) | 640 | — | 0.065 |
| 23 | 422.4 | 6.8 | 6.42 no therm treat | 690 | — | 0.067 |

Preparing Electroconductive Layers of Type 2 with
Dispersions Based on the Dispersions of Example 3

Coating dispersions were produced by adding 3-glycidoxypropyl-trimethoxysilane, ZONYL™ FSO100 and diethylene glycol to the aqueous PEDOT/PSS-dispersions produce coverages upon coating on a poly(ethylene terephthalate) support subbed with subbing layer 1 and then drying for 1 minute at 140° C., with the following composition:

| | |
|---|---|
| PEDOT/PSS: | quantity was varied to maintain a constant PEDOT coverage of 20.2 mg/m² |
| 3-glycidoxypropyltri-methoxysilane: | 24 mg/m² |
| ZONYL ™ FSO 100: | 11 mg/m² |
| diethylene glycol [DEG] (theoretical): | 1.33 mL/m² |

Characterization of Electroconductive Layers of
Type 2 Prepared with Dispersions Based on the
Dispersions of Example 3

The optical density and surface resistance of the layers was determined as described above for electroconductive layers of type 1. The results are summarized in Table 10.

TABLE 10

| PEDOT type | Coverage of total layer [mg/m²] | wt % of PEDOT in layer | PSSA/PEDOT weight ratio | PSSA/PEDOT molar ratio | surface resistance [Ohm/square] | OD excl. support |
|---|---|---|---|---|---|---|
| 10 | 75.2 | 26.9 | 0.99 | 0.76 | 1340 | 0.017 |
| 12 | 86.9 | 23.2 | 1.57 | 1.21 | 869 | 0.016 |
| 14 | 105 | 19.2 | 2.46 | 1.90 | 736 | 0.012 |
| 15 | 105 | 19.2 | 2.46 | 1.90 | 794 | 0.013 |
| 16 | 105 | 19.2 | 2.46 | 1.90 | 754 | 0.013 |
| 17 | 120.0 | 16.8 | 3.21 | 2.48 | 640 | 0.013 |
| 20 | 184.9 | 10.9 | 6.42 | 4.96 | 520 | 0.013 |

The resulting freeze-dried samples were then analysed by $^{13}$C CP/MAS with a 200 MHz spectrometer at 11 different contact times in the ms range at a spin speed of 6.4 kHz, each measurement being repeated 3000 times to increase the signal to noise ratio. This total procedure as described in 2002 by P. Adriaensens et al., Polymer, volume 43, pages 7003 to 7006, took 30 h for each sample. The C-shift from the EDOT ring (68 ppm) is well-separated from the aliphatic PSS signals (around 40 ppm). The ln(Intensity) versus contact time (CT) characteristics were analyzed according to the relationship:

$$\ln(\text{Carbon intensity}) = \ln(\text{Initial carbon intensity}_o) - t/T_{1\rho}H$$

and the initial carbon intensities thereby derived used to determine the quantitative molar ratio of PSS:PEDOT. The $T_{1\rho}H$ relaxation times are different for each signal and also different for each sample. Quantitative results require such long measurement sequence. The $T_{1\rho}H$ relaxation times for aromatic PSS carbon atoms, aliphatic PSS carbon atoms and carbon atoms of the PEDOT-ether group for each PEDOT-type are given in Table 11 below.

The results in Table 10 surprisingly show that the surface resistance decreased with increasing PSS:PEDOT ratio for layers containing PEDOT/PSS produced in the substantial absence of oxygen, according to the present invention. This is at variance with the data available in the literature for PEDOT/PSS which shows that the surface resistance increases with increasing PSS:PEDOT ratio, see, for example, the paper published in 1999 by M. Lefebvre et al. in Chem. Mater., volume 11, pages 262-268, as mentioned above.

Determination of Actual PSS/PEDOT Ratio

Samples of the PEDOT-dispersions of types 10, 13, 17 and 19/20 were freeze dried were freeze dried under high vacuum (0.7 mbar) in a CHRIST BETA2-16 shelf freeze-dryer until all of the water was evaporated (i.e. until the temperature of the shelves was equal to room temperature) and dry powders were obtained.

TABLE 11

| PEDOT type | $T_{1\rho}H$ of PSS aromatic carbon atoms [ms] | $T_{1\rho}H$ of PSS aliphatic carbon atoms [ms] | $T_{1\rho}H$ of PEDOT ether carbon atoms [ms] |
|---|---|---|---|
| 13 | 3.6 | 2.3 | 2.8 |
| 17 | 4.4 | 3.1 | 2.9 |
| 19/20 | 2.8 | 1.9 | 1.9 |
| 10 | 1.6 | 1.0 | 1.1 |

The thereby obtained initial aromatic carbon atom intensities of PSS, the initial aliphatic carbon atom intensity of PSS, the average of the initial carbon atom intensities of PSS, the initial ether carbon atom intensity of PEDOT and the ratios of the average of the initial carbon atom intensities of PSS and of the initial ether carbon atom intensity of PEDOT are given in Table 12 together with the theoretical PSS/PEDOT molar ratio.

TABLE 12

| PEDOT type | PSS/ PEDOT molar ratio (theoretical) | Initial aromatic carbon atom intensity of PSS | Initial aliphatic carbon atom intensity of PSS | Average initial carbon atom intensity of PSS | Initial ether carbon atom intensity of PEDOT | Average Initial carbon atom intensity of PSS/Initial ether carbon intensity of PEDOT |
|---|---|---|---|---|---|---|
| 13 | 1.55 | 232 | 223 | 228 | 155 | 1.47 |
| 17 | 2.45 | 421 | 415 | 418 | 160 | 2.61 |
| 19/20 | 4.91 | 343 | 335 | 339 | 66 | 5.14 |
| 10 | 0.76 | 73 | 47 | 60 | 73 | 0.82 |

The agreement between the theoretical and actual PSS/PEDOT molar ratios is very good, showing the efficacy of the method used. Therefore, the molar ratio obtained from $^{13}C$ CP/MAS analysis is in total agreement with the theoretical molar ratio.

Example 4

The quantity of poly(styrene sulphonic acid)[PSS] (Mn=160,000 and Mw=600,000) solution given in Table 13 was mixed with the quantity of deionized water given for the particular PEDOT-type in Table 13 at 25° C. in the appropriate reaction vessel equipped with a stirrer and a nitrogen inlet. After bubbling nitrogen through this mixture for 30 minutes, the quantity of EDOT for the particular PEDOT-type given in Table 13 was then added to this solution, giving a EDOT-concentration of 30 mM. The concentration of oxygen in this solution was <1.0 mg/L as measured with a Knick Process Unit 73 $O_2$, using InPro 6000 Series $O_2$. The quantities of $Fe_2(SO_4)_3 \cdot 9H_2O$ and $Na_2S_2O_8$ corresponding to concentrations of 0.13 and 41.6 mM respectively were then added to initiate the polymerization reaction. The concentration of EDOT in the reaction mixtures was 30 mM and that of PSS was 46 mM for PEDOT-type 24, 37 mM for PEDOT-type 25, 57 mM for PEDOT-type 26, 69 mM for PEDOT-type 27 and 93 mM for PEDOT-type 28. The reaction mixtures were then stirred at 25° C. for 7 h, after which a further quantity of $Na_2S_2O_8$ for the particular PEDOT-type was added corresponding to a concentration of 6.94 mM. After an additional reaction time of 16 h the reaction mixtures were treated twice with ion exchanger (300 mL Lewatit™ S100MB+500 mL Lewatit™ M600MB). The resulting mixtures were further thermally treated at 95° C. for 2 h and the resulting viscous mixture treated with high shear [microfluidizer at 60 MPa (600 Bar)].

TABLE 13

| PEDOT type | EDOT weight [g] | PSS 4.9 wt % solution weight of [g] | final concentration [mM] | $Fe_2(SO_4)_3 \cdot 9H_2O$ weight [g] | $Na_2S_2O_8$ initially added [g] | $Na_2S_2O_8$ added after 7 h [g] | Water weight [g] |
|---|---|---|---|---|---|---|---|
| 24 | 8.52 | 424.93 | 46 | 0.149 | 17.13 | 2.86 | 1575.07 |
| 25 | 8.52 | 523.69 | 37 | 0.149 | 17.13 | 2.86 | 1476.31 |
| 26 | 8.52 | 523.69 | 57 | 0.149 | 17.13 | 2.86 | 1476.31 |
| 27 | 8.52 | 637.4 | 69 | 0.149 | 17.13 | 2.86 | 1362.6 |
| 28 | 8.52 | 849.3 | 93 | 0.149 | 17.13 | 2.86 | 1150.7 |

The resulting PSS:PEDOT weight and molar ratios, PEDOT/PSS-concentrations, viscosity as measured in an Ubbelohde viscometer in a bath thermostatted at 25° C., the peak particle sizes in the bimodal size distribution and the number of particles per mL with a particle size greater than 1 μm are given in Table 14.

TABLE 14

| PEDOT type | PSS/PEDOT weight ratio | PSS/PEDOT molar ratio | PEDOT/PSS-conc. [% by weight] | visco [cP] | Peak particle size after homogenization [nm] | # part/ mL >1 μm |
|---|---|---|---|---|---|---|
| 24 | 2.00 | 1.54 | 0.93 | 240 | 67 | $8.2 \times 10^5$ |
| 25 | 2.46 | 1.90 | 1.21 | 10 | 101 | $7.9 \times 10^5$ |
| 26 | 2.46 | 1.90 | 1.22 | 50 | 98 | $7.2 \times 10^5$ |
| 27 | 3.00 | 2.32 | 1.35 | 31 | 87 | $8.0 \times 10^5$ |
| 28 | 4.00 | 3.09 | 1.75 | 57 | 83 | $8.4 \times 10^5$ |

Preparation and Characterization of
Electroconductive Layers of Type 1 with Dispersions
Based on the Dispersions of Example 4

The electroconductive layers of type 1 with dispersions based on the dispersions of EXAMPLE 4 were prepared and characterized as described for the dispersions of EXAMPLE 3. The results are summarized in Table 15 for the type 1 electroconductive layers.

TABLE 15

| PEDOT type | Coverage of total layer [mg/m$^2$] | wt % of PEDOT in layer | PSSA/PEDOT weight ratio | PSSA/PEDOT molar ratio | surface resistance [Ohm/square] | OD incl. support |
|---|---|---|---|---|---|---|
| 24 | 294.7 | 9.8 | 2.00 | 1.54 | 3300 | 0.059 |
| 25 | 308   | 9.4 | 2.46 | 1.90 | 1900 | 0.063 |
| 26 | 308   | 9.4 | 2.46 | 1.90 | 1700 | 0.063 |
| 27 | 323.6 | 8.9 | 3.00 | 2.32 | 1500 | 0.062 |
| 28 | 352.5 | 8.2 | 4.00 | 3.09 | 1300 | 0.062 |

The results in Table 15 confirm the results in Table 9 surprisingly showing that the surface resistance decreased with increasing PSS:PEDOT ratio for layers containing PEDOT/PSS produced in the substantial absence of oxygen, according to the present invention.

Invention Example 5

The quantity of poly(styrene sulphonic acid)[PSS] (VERSA TL77 from ALCO with Mn=25,000 and Mw=72,000) solution given in Table 13 was mixed with sufficient deionized water at 25° C. to give 2000 g of solution in the appropriate reaction vessel equipped with a stirrer, see quantity in Table 16 for the particular PEDOT-type. The quantity of EDOT for the particular PEDOT-type given in Table 15 was then added to this solution, giving a EDOT-concentration of 30 mM. The concentration of oxygen in this solution was measured with a Knick Process Unit 73 O$_2$, using InPro 6000 Series O$_2$. The quantities of Fe$_2$(SO$_4$)$_3$·9H$_2$O and Na$_2$S$_2$O$_8$ corresponding to concentrations of 0.13 and 41.6 mM respectively were then added to initiate the polymerization reaction. The concentration of EDOT in the reaction mixtures was 30 mM and the final concentration of PSS in the reacion medium is given in Table 16 for the particular PEDOT-type. The reaction mixtures were then stirred at 25° C. for 7 h, after which a further quantity of Na$_2$S$_2$O$_8$ for the particular PEDOT-type was added corresponding to a concentration of 6.94 mM. After an additional reaction time of 16 h the reaction mixtures were treated twice with ion exchanger (300 mL Lewatit™ S100MB+500 mL Lewatit™ M600MB). The resulting mixtures were further thermally treated at 95° C. for 2 h and the resulting viscous mixture treated with high shear [microfluidizer at 60 MPa (600 Bar)].

TABLE 16

| PEDOT type | EDOT weight [g] | quantity of oxygen in reaction medium [mg/L] | PSS weight of 4.9 wt % solution [g] | PSS final concentration [mM] | Fe$_2$(SO$_4$)$_3$·9H$_2$O weight [g] | Na$_2$S$_2$O$_8$ initially added [g] | Na$_2$S$_2$O$_8$ added after 7 h [g] | Water weight [g] |
|---|---|---|---|---|---|---|---|---|
| 29 | 8.52 | 6404 | 213.87  | 28  | 0.149 | 17.3 | 2.86 | 1786.13 |
| 30 | 8.52 | 4878 | 340.81  | 45  | 0.149 | 17.3 | 2.86 | 1659.19 |
| 31 | 8.52 | 8360 | 428.57  | 57  | 0.149 | 17.3 | 2.86 | 1571.43 |
| 32 | 8.52 | 7510 | 695.51  | 93  | 0.149 | 17.3 | 2.86 | 1304.49 |
| 33 | 8.52 | 7073 | 1391.02 | 185 | 0.149 | 17.3 | 2.86 | 608.98  |

The molecular weights of the PEDOT in PEDOT-dispersions type 26 to 30 was determined by aqueous gel permeation chromatography as described in EXAMPLE 3 are given in Table 17.

TABLE 17

| PEDOT type | PSS/PEDOT weight ratio [theoretical] | PSS/PEDOT molar ratio [theoretical] | Mw | viscosity [cP] | Peak particle size after homogenization [nm] |
|---|---|---|---|---|---|
| 29 | 1.23 | 0.95 | $4.8 \times 10^5$ | 14 | 32 |
| 30 | 1.96 | 1.51 | $6.7 \times 10^5$ | 17.5 | 30 |
| 31 | 2.46 | 1.90 | $7.0 \times 10^5$ | 22.5 | 26 |
| 32 | 4.0 | 3.09 | $7.2 \times 10^5$ | 55 | 26 |
| 33 | 8.0 | 6.17 | $9.2 \times 10^5$ | 125 | 29 |

Preparation and Characterization of Electroconductive Layers of Type 1 with Dispersions Based on the Dispersions of Example 5

The electroconductive layers of type 1 with dispersions based on the dispersions of EXAMPLE 5 were prepared and characterized as described for the dispersions of EXAMPLE 3. The results are summarized in Table 18 for the type 1 electroconductive layers.

TABLE 18

| PEDOT type | Coverage of total layer [mg/m$^2$] | wt % of PEDOT in layer | PSSA/PEDOT weight ratio | PSSA/PEDOT molar ratio | surface resistance [Ohm/square] | OD excl. support |
|---|---|---|---|---|---|---|
| 29 | 272.4 | 10.6 | 1.23 | 0.95 | 9710 | 0.029 |
| 30 | 293.5 | 9.8 | 1.96 | 1.51 | 4240 | 0.029 |
| 31 | 308 | 9.4 | 2.46 | 1.90 | 4120 | 0.028 |
| 32 | 352.5 | 8.2 | 4.0 | 3.09 | 3650 | 0.024 |
| 33 | 468.1 | 6.2 | 8.0 | 6.17 | 2280 | 0.026 |

The results in Table 18 surprisingly show that even for PEDOT/PSS-dispersions prepared with a particular concentration of oxygen in the reaction medium the surface resistance decreased with increasing PSS:PEDOT ratio for layers containing PEDOT/PSS produced in the substantial absence of oxygen, according to the present invention. This is at variance with the data available in the literature for PEDOT/PSS which shows that the surface resistance increases with increasing PSS:PEDOT ratio, see, for example, the paper published in 1999 by M. Lefebvre et al. in Chem. Mater., volume 11, pages 262-268, as mentioned above.

Preparation and Characterization of Electroconductive Layers of Type 2 with Dispersions Based on the Dispersions of Example 5

The electroconductive layers of type 2 with dispersions based on the dispersions of EXAMPLE 5 were prepared and characterized as described for the dispersions of EXAMPLE 3. The results are summarized in Table 19 for the type 1 electroconductive layers.

The results in Table 19 surprisingly again show that even for PEDOT/PSS-dispersions prepared with a particular concentration of oxygen in the reaction medium the surface resistance decreased with increasing PSS:PEDOT ratio for layers containing PEDOT/PSS produced in the substantial absence of oxygen, according to the present invention. This is at variance with the data available in the literature for PEDOT/PSS which shows that the surface resistance increases with increasing PSS:PEDOT ratio, see, for example, the paper published in 1999 by M. Lefebvre et al. in Chem. Mater., volume 11, pages 262-268, as mentioned above.

TABLE 19

| PEDOT type | Coverage of total layer [mg/m$^2$] | wt % of PEDOT in layer | PSSA/PEDOT weight ratio | PSSA/PEDOT molar ratio | surface resistance [Ohm/square] | OD excl. support |
|---|---|---|---|---|---|---|
| 29 | 80.0 | 25.3 | 1.23 | 0.95 | 2850 | 0.017 |
| 30 | 94.8 | 21.3 | 1.96 | 1.51 | 1880 | 0.014 |
| 31 | 105 | 19.2 | 2.46 | 1.90 | 1930 | 0.013 |
| 32 | 136.0 | 14.9 | 4.0 | 3.09 | 1610 | 0.010 |
| 33 | 216.8 | 9.3 | 8.0 | 6.17 | 1070 | 0.013 |

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. An aqueous dispersion of latex particles, said latex particles containing a polymer consisting of structural units including monomer units according to formula (I):

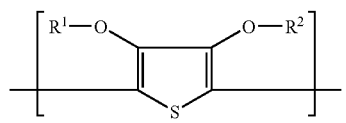

in which $R^1$ and $R^2$ independently of one another represent hydrogen or a $C_{1-5}$-alkyl group or together form an optionally substituted $C_{1-5}$-alkylene residue and at least one polyanion compound, said latex having a primary particle size of less than 40 nm and said dispersion contains an organic compound containing a di- or polyhydroxy- and/or carboxy groups or amide or lactam group or an aprotic compound with a dielectric constant, $\epsilon$, $\geq 15$, wherein said latex particles contain said at least one polyanion compound and said polymer in a weight ratio of at least 4 and wherein said latex particles are prepared in a reaction medium in the substantial absence of oxygen.

2. Aqueous dispersion of a latex according to claim 1, wherein the weight ratio of said at least one polyanion compound to said polymer corresponds to the weight ratio of the monomer(s) constituting said polymer to said at least one polyanion compound during the preparation thereof.

3. Aqueous dispersion of a latex according to claim 1, wherein said latex particles contain said at least one polyanion compound and said polymer in a weight ratio of greater than 4 and less than 20.

4. Aqueous dispersion of a latex according to claim 1, wherein said latex is prepared in a reaction medium with less than 8500 mg of oxygen/L of said reaction medium when the initiator is added.

5. Aqueous dispersion of a latex according to claim 1, wherein said latex is prepared in a reaction medium with less than 2000 mg of oxygen/L of said reaction medium when the initiator is added.

6. Aqueous dispersion of a latex according to claim 1, wherein said latex is prepared in a reaction medium with less than 1000 mg of oxygen/L of said reaction medium when the initiator is added.

7. Aqueous dispersion of a latex according to claim 1, wherein said monomer units according to formula (I) are selected from the group consisting of alkyl group-substituted 3,4-methylenedioxy-thiophene units, 3,4-methylenedioxythiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

8. Aqueous dispersion of a latex according to claim 1, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

9. Aqueous dispersion of a latex according to claim 8, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

10. Aqueous dispersion of a latex according to claim 1, wherein said at least one polyanion compound includes poly(styrene sulphonic acid).

11. A process for preparing an electroconductive coating comprising the steps of: preparing an aqueous dispersion of latex particles according to claim 1 by polymerization of said monomer units with an initiator in a reaction medium in the presence of at least one polyanion compound; preparing a first coating composition containing said aqueous dispersion of latex particles; coating said first coating composition on an object thereby producing a first layer; and heating said first layer at a temperature of at least 100° C.

12. Process according to claim 11, wherein when said initiator is added less than 850 mg of oxygen per liter of the reaction medium is present in the reaction medium.

13. Process according to claim 11, wherein when said initiator is added less than 200 mg of oxygen per liter of said reaction medium is present in said reaction medium.

14. Process according to claim 11, wherein when said initiator is added less than 100 mg of oxygen per liter of said reaction medium is present in said reaction medium.

15. Process according to claim 11, wherein said monomer units according to formula (I) are selected from the group consisting of alkyl group-substituted 3,4-methylenedioxythiophene units, 3,4-methylenedioxy-thiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

16. Process according to claim 11, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

17. Process according to claim 16, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

18. Process according to claim 11, wherein said at least one polyanion compound includes poly(styrene sulphonic acid).

19. A process for preparing an electroconductive coating comprising the steps of: preparing an aqueous dispersion of latex particles according to claim 1 by polymerization of said monomer units with an initiator in a reaction medium in the presence of at least one polyanion compound; preparing a second coating composition containing said aqueous dispersion of latex particles; coating said second coating composition on an object thereby producing a second layer; and heating said second layer at a temperature of at least 50° C.

20. Process according to claim 19, wherein when said initiator is added less than 850 mg of oxygen per liter of the reaction medium is present in the reaction medium.

21. Process according to claim 19, wherein when said initiator is added less than 200 mg of oxygen per liter of said reaction medium is present in said reaction medium.

22. Process according to claim 19, wherein when said initiator is added less than 100 mg of oxygen per liter of said reaction medium is present in said reaction medium.

23. Process according to claim 19, wherein said monomer units according to formula (I) are selected from the group consisting of alkyl group-substituted 3,4-methylenedioxythiophene units, 3,4-methylenedioxy-thiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

24. Process according to claim 19, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

25. Process according to claim 24, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

26. Process according to claim 19, wherein said at least one polyanion compound includes poly(styrene sulphonic acid).

27. An aqueous dispersion of latex particles, said latex particles containing a polymer consisting of structural units including monomer units according to formula (I):

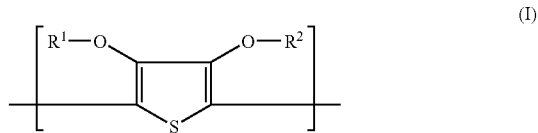

(I)

in which $R^1$ and $R^2$ independently of one another represent hydrogen or a $C_{1-5}$-alkyl group or together form an optionally substituted $C_{1-5}$-alkylene residue and at least one polyanion compound, said latex having a primary particle size of less than 40 nm and said dispersion contains an organic compound containing a di- or polyhydroxy- and/or carboxy groups or amide or lactam group or an aprotic compound with a dielectric constant, $\in, \geqq 15$, wherein said latex particles contain said at least one polyanion compound and said polymer in a weight ratio of at least 4, wherein the concentration of said structural units in the reaction medium during preparation of said aqueous dispersion is 60 mM or less, and wherein said latex particles are prepared in a reaction medium in the substantial absence of oxygen.

28. Aqueous dispersion of a latex according to claim 27, wherein the weight ratio of said at least one polyanion compound to said polymer corresponds to the weight ratio of the monomer(s) constituting said polymer to said at least one polyanion compound during the preparation thereof.

29. Aqueous dispersion of a latex according to claim 27, wherein said latex particles contain said at least one polyanion compound and said polymer in a weight ratio of greater than 4 and less than 20.

30. Aqueous dispersion of a latex according to claim 27, wherein said latex is prepared in a reaction medium with less than 8500 mg of oxygen/L of said reaction medium when the initiator is added.

31. Aqueous dispersion of a latex according to claim 27, wherein said latex is prepared in a reaction medium with less than 2000 mg of oxygen/L of said reaction medium when the initiator is added.

32. Aqueous dispersion of a latex according to claim 27, wherein said latex is prepared in a reaction medium with less than 1000 mg of oxygen/L of said reaction medium when the initiator is added.

33. Aqueous dispersion of a latex according to claim 27, wherein said monomer units according to formula (I) are selected from the group consisting of [optionally] alkyl group-substituted 3,4-methylenedioxy-thiophene units, 3,4-methylenedioxy-thiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

34. Aqueous dispersion of a latex according to claim 27, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

35. Aqueous dispersion of a latex according to claim 34, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

36. Aqueous dispersion of a latex according to claim 27, wherein said at least one polyanion compound includes poly(styrene sulphonic acid).

37. A process for preparing an electroconductive coating comprising the steps of: preparing an aqueous dispersion of latex particles according to claim 27 by polymerization of said monomer units with an initiator in a reaction medium in the presence of at least one polyanion compound; preparing a first coating composition containing said aqueous dispersion of latex particles; coating said first coating composition on an object thereby producing a first layer; and heating said first layer at a temperature of at least 100° C.

38. Process according to claim 37, wherein when said initiator is added less than 850 mg of oxygen per liter of the reaction medium is present in the reaction medium.

39. Process according to claim 37, wherein when said initiator is added less than 200 mg of oxygen per liter of said reaction medium is present in said reaction medium.

40. Process according to claim 37, wherein when said initiator is added less than 100 mg of oxygen per liter of said reaction medium is present in said reaction medium.

41. Process according to claim 37, wherein said monomer units according to formula (I) are selected from the group consisting of alkyl group-substituted 3,4-methylenedioxy-thiophene units, 3,4-methylenedioxy-thiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

42. Process according to claim 37, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

43. Process according to claim 42, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

44. Process according to claim 37, wherein said at least one polyanion compound includes poly(styrene sulphonic acid).

45. A process for preparing an electroconductive coating comprising the steps of: preparing an aqueous dispersion of latex particles according to claim 27 by polymerization of said monomer units with an initiator in a reaction medium in the presence of at least one polyanion compound; preparing a second coating composition containing said aqueous dispersion of latex particles; coating said second coating composition on an object thereby producing a second layer; and heating said second layer at a temperature of at least 50° C.

46. Process according to claim 45, wherein when said initiator is added less than 850 mg of oxygen per liter of the reaction medium is present in the reaction medium.

47. Process according to claim 45, wherein when said initiator is added less than 200 mg of oxygen per liter of said reaction medium is present in said reaction medium.

48. Process according to claim 45, wherein when said initiator is added less than 100 mg of oxygen per liter of said reaction medium is present in said reaction medium.

49. Process according to claim 45, wherein said monomer units according to formula (I) are selected from the group consisting of alkyl group-substituted 3,4-methylenedioxy-thiophene units, 3,4-methylenedioxy-thiophene units, alkyl or aryl-group-substituted 3,4-ethylenedioxythiophene units, 3,4-ethylenedioxythiophene units, a unit according to formula (I) in which $R^1$ and $R^2$ are together a 1,2-cyclohexylene group, alkyl or aryl-group-substituted 3,4-propylenedioxythiophene units, 3,4-propylenedioxythiophene units, alkyl or aryl-group-substituted 3,4-butylenedioxythiophene units, 3,4-butylenedioxythiophene units, alkyl or aryl-group-substituted 3,4-pentylenedioxythiophene units and 3,4-pentylenedioxythiophene units.

50. Process according to claim 45, wherein said polymer is a copolymer of a 3,4-alkylenedioxythiophene compound with a solubility in water at 25° C. of less than 2.2 g/L with a 3,4-alkylenedioxythiophene compound with a solubility in water at 25° C. of at least 2.2 g/L.

51. Process according to claim 50, wherein said 3,4-alkylenedioxythiophene compound with a solubility in water at 25° C. of at least 2.2 g/L is selected from the group consisting of: 3,4-dihydro-2H-thieno[3,4-b][1,4]dioxin-2-yl)methanol, 3,4-dihydro-2H-thieno[3,4-b][1,4]dioxepin-3-ol, (2,3-dihydro-thieno[3,4-b][1,4]dioxin-2-yl-methoxy)-acetic acid ethyl ester, (2,3-dihydro-thieno[3,4-b][1,4]dioxin-2-yl-methoxy)-acetic acid, 2-{2-[2-(2-methoxy-ethoxy)-ethoxy]-ethoxymethyl}-2,3-dihydro-thieno[3,4-b][1,4]dioxine and 4-(2,3-dihydro-thieno[3,4-b][1,4]dioxin-2-ylmethoxy)-butane-1-sulfonic acid sodium salt.

52. Process according to claim 45, wherein said at least one polyanion compound includes poly(styrene sulphonic acid).

53. An aqueous dispersion of latex particles, said latex particles containing a polymer consisting of structural units including monomer units according to formula (I):

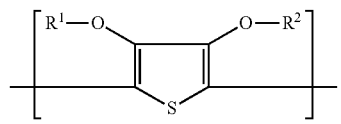

in which $R^1$ and $R^2$ independently of one another represent hydrogen or a $C_{1-5}$-alkyl group or together form an optionally substituted $C_{1-5}$-alkylene residue and at least one polyanion compound, said latex having a primary particle size of less than 40 nm and said dispersion contains an organic compound containing a di- or polyhydroxy- and/or carboxy groups or amide or lactam group or an aprotic compound with a dielectric constant, $\in$, $\geqq 15$, wherein said latex particles contain said at least one polyanion compound and said polymer in a weight ratio in the range of 5:1 to 20:1, and wherein said latex particles are prepared in a reaction medium in the substantial absence of oxygen.

54. Aqueous dispersion according to claim 53, wherein the concentration of said structural units in the reaction medium during preparation of said aqueous dispersion is 60 mM or less.

55. A process for preparing an electroconductive coating comprising the steps of: preparing an aqueous dispersion of latex particles according to claim 53 by polymerization of said monomer units with an initiator in a reaction medium in the presence of at least one polyanion compound; preparing a first coating composition containing said aqueous dispersion of latex particles; coating said first coating composition on an object thereby producing a first layer; and heating said first layer at a temperature of at least 100° C.

56. Process according to claim 55, wherein the concentration of said structural units in said reaction medium is 60 mM or less.

57. A process for preparing an electroconductive coating comprising the steps of: preparing an aqueous dispersion of latex particles according to claim 53 by polymerization of said monomer units with an initiator in a reaction medium in the presence of at least one polyanion compound; preparing a second coating composition containing said aqueous dispersion of latex particles; coating said second coating composition on an object thereby producing a second layer; and heating said second layer at a temperature of at least 50° C.

58. Process for preparing an electroconductive coating according to claim 57, wherein the concentration of said structural units in said reaction medium is 60 mM or less.

59. The aqueous dispersion of latex particles according to claim 1, wherein said aqueous latex particles is prepared in a reaction medium with less than 100 mg of oxygen/L of said reaction medium when the initiator is added.

60. The aqueous dispersion of latex particles according to claim 27, wherein said aqueous dispersion of latex is prepared in a reaction medium with less than 100 mg of oxygen/L of said reaction medium when the initiator is added.

61. The aqueous dispersion of latex particles according to claim 53, wherein said aqueous dispersion of latex is prepared in a reaction medium with less than 100 mg of oxygen/L of said reaction medium when the initiator is added.

* * * * *